United States Patent
Fukuoka

(10) Patent No.: US 8,326,559 B2
(45) Date of Patent: Dec. 4, 2012

(54) SUBSTRATE PROCESSING SYSTEM, SYSTEM INSPECTING METHOD, SYSTEM INSPECTING PROGRAM AND RECORDING MEDIUM STORING THE PROGRAM RECORDED THEREIN

(75) Inventor: Tetsuo Fukuoka, Koshi (JP)

(73) Assignee: Tokyo Electron Limited, Tokyo-To (JP)

( * ) Notice: Subject to any disclaimer, the term of this patent is extended or adjusted under 35 U.S.C. 154(b) by 521 days.

(21) Appl. No.: 12/302,118

(22) PCT Filed: Apr. 23, 2007

(86) PCT No.: PCT/JP2007/058701
§ 371 (c)(1),
(2), (4) Date: Nov. 24, 2008

(87) PCT Pub. No.: WO2007/135834
PCT Pub. Date: Nov. 29, 2007

(65) Prior Publication Data
US 2009/0292491 A1 Nov. 26, 2009

(30) Foreign Application Priority Data
May 23, 2006 (JP) .................. 2006-142664

(51) Int. Cl.
*G06F 17/40* (2006.01)
*G06F 17/00* (2006.01)
(52) U.S. Cl. ............... 702/81; 702/83; 702/84; 700/121
(58) Field of Classification Search ............ 702/81, 702/82–84
See application file for complete search history.

(56) References Cited

U.S. PATENT DOCUMENTS

| | | | | |
|---|---|---|---|---|
| 6,235,634 B1 * | 5/2001 | White et al. | .................. | 438/680 |
| 6,264,748 B1 * | 7/2001 | Kuriki et al. | .................. | 118/719 |
| 6,281,962 B1 * | 8/2001 | Ogata et al. | ..................... | 355/27 |
| 6,803,554 B2 | 10/2004 | Ye et al. | | |
| 6,806,456 B1 | 10/2004 | Ye et al. | | |
| 6,828,542 B2 | 12/2004 | Ye et al. | | |
| 6,879,866 B2 * | 4/2005 | Tel et al. | ....................... | 700/100 |
| 6,884,984 B2 | 4/2005 | Ye et al. | | |
| 6,969,837 B2 | 11/2005 | Ye et al. | | |
| 6,969,864 B2 | 11/2005 | Ye et al. | | |
| 7,053,355 B2 | 5/2006 | Ye et al. | | |
| 2003/0226951 A1 * | 12/2003 | Ye et al. | ..................... | 250/208.1 |
| 2004/0119036 A1 | 6/2004 | Ye et al. | | |
| 2004/0140418 A1 | 7/2004 | Ye et al. | | |

(Continued)

FOREIGN PATENT DOCUMENTS

JP 6-45228 2/1994

(Continued)

*Primary Examiner* — Hal Wachsman
(74) *Attorney, Agent, or Firm* — Oblon, Spivak, McClelland, Maier & Neustadt, L.L.P.

(57) ABSTRACT

A substrate processing system provided with a plurality of modules for substrate processing. The substrate processing system includes an inspection substrate, which is transferred to the plurality of modules for processing therein, provided with a plurality of measuring devices which carry out a plurality of different kinds of measurements and a recorder which records measured data provided by the measuring devices. The substrate processing system includes a controller that executes control operations to subject the inspection substrate to predetermined processes in the plurality of modules. The controller obtains through data communication a plurality of different kinds of measured data recorded by the recorder as the inspection substrate is processed by the predetermined processes by the plurality of modules.

14 Claims, 5 Drawing Sheets

U.S. PATENT DOCUMENTS

| | | |
|---|---|---|
| 2004/0222354 A1 | 11/2004 | Ye et al. |
| 2004/0232313 A1 | 11/2004 | Ye et al. |
| 2005/0140955 A1* | 6/2005 | Butler et al. .................... 355/69 |
| 2006/0000964 A1 | 1/2006 | Ye et al. |
| 2006/0195216 A1* | 8/2006 | Hashinoki et al. ............ 700/112 |

FOREIGN PATENT DOCUMENTS

| | | |
|---|---|---|
| JP | 2000 235949 | 8/2000 |
| JP | 2003 218015 | 7/2003 |
| JP | 2004 251876 | 9/2004 |
| JP | 2004 342822 | 12/2004 |

* cited by examiner

SUBSTRATE PROCESSING SYSTEM, SYSTEM INSPECTING METHOD, SYSTEM INSPECTING PROGRAM AND RECORDING MEDIUM STORING THE PROGRAM RECORDED THEREIN

TECHNICAL FIELD

The present invention relates to a substrate processing system provided with a plurality of modules for carrying out a series of processes, a system inspecting method, a system inspecting program and a recording medium storing the program.

BACKGROUND ART

A photolithographic process among processes for fabricating an electronic device, such as a semiconductor device, is carried out in an in-line mode by using, in combination, a coating and developing system, namely, a unit for carrying out a coating process for applying a resist solution (hereinafter, referred to as "resist") to a substrate, such as a wafer, and a developing process, and an exposure system for processing a substrate coated with a resist by an exposure process. More concretely, a predetermined circuit pattern is formed in a resist layer by subjecting a substrate to a series of processes including, for example, main steps of cleaning, dehydration baking, adhesion promotion (hydrophobicity impartation), resist application, prebaking, exposure, post-exposure baking and post-baking. Such an in-line photolithographic process is mentioned in Patent document 1.

Patent document 1: JP 2000-235949 A

The processing modules of this coating and developing system need to be tested by predetermined measurement and inspection at the time of installation and by periodic inspection to achieve accurate substrate processing and to prevent troubles. For example, the levelness of a substrate held by suction on a spin chuck needs to be measured for the inspection of a coating device (module), and the velocity of air acting on a substrate and heating temperature need to be measured for the inspection of a heat-processing device (module). It is desirable to measure the atmospheric pressure and the humidity on the surface of a substrate held in each module for inspection.

It has been usual to inspect the modules individually by measurement and to execute adjustment on the basis of measured data.

DISCLOSURE OF THE INVENTION

Problem to be Solved by the Invention

Since the foregoing coating and developing system processes many substrates one by one in a single-wafer processing mode, the coating and developing system is provided with modules, such as a plurality of heat-processing devices and a plurality of coating devices, stacked in layers. Therefore, the foregoing measurement of all the modules needs to be performed for inspection. A plurality of measuring objects (levelness, heating temperature, air velocity, atmospheric pressure, humidity and such) need to be measured sequentially in each of those modules. Thus, the inspection of the entire coating and developing system requires much time and labor, which reduces operational efficiency.

Since a plurality of kinds of measuring operations are performed for each module, measured data obtained by the different kinds of measuring operations needs to be obtained and managed individually every time the measured data is obtained. Therefore, the acquisition of inspection data on the entire coating and developing system requires much time and labor and cannot efficiently be achieved.

The present invention has been made in view of the foregoing problems and it is therefore an object of the present invention to provide a substrate processing system provided with a plurality of modules for processing a substrate capable of improving the efficiency of inspection operations for inspecting all the modules thereof and of easily managing information about the results of inspection, a system inspecting method, a system inspecting program and a recording medium storing the system inspecting program.

Means for Solving the Problem

A substrate processing system according to the present invention provided with a plurality of modules for processing a substrate and capable of carrying out the measurement of the plurality of modules for inspection includes an inspection substrate provided with a plurality of measuring means for carrying out a plurality of different kinds of measurement and a recording means for recording measured data provided by the measuring means; and a control means that executes control operations to subject the inspection substrate to predetermined processes in the plurality of modules; wherein the control means obtains a plurality of different kinds of measured data recorded in the recording means from the inspection substrate processed by the predetermined processes by the plurality of modules through data communication. Desirably, the substrate processing system includes a substrate holding unit for holding the inspection substrate in a period in which the inspection substrate is not subjected to the predetermined processes in the plurality of modules. Desirably, the substrate holding unit is provided with a first communication means for data communication with the inspection substrate under the control of the control means, the inspection substrate is provided with a second communication means for communication with the first communication means, and the first and the second communication means communicate with each other for data communication by a wire communication system or a wireless communication system.

A plurality of kinds of measurement can be simultaneously achieved in each module by the plurality of different kinds of measuring means held in the single inspection substrate. Since the measured data is recorded in the recording means, the plurality of kinds of measurement can be continuously performed for all the modules to be inspected, and all the measured data on all the modules can be eventually obtained through data communication.

Accordingly, the efficiency of the inspection operations for inspecting all the modules can be improved and the information about the results of inspection can be easily managed.

Preferably, the substrate holding unit is provided with a power supply means for supplying power to the inspection substrate, the inspection substrate has a battery as a driving power source for driving an electric circuit including at least the plurality of measuring means, and the power supply means supplies power to the battery by a wire transmission system or a wireless transmission system to charge the battery.

The measuring means of the inspection substrate can be operated in the modules by thus providing the inspection substrate with the battery and charging the battery by the power supply means.

Desirably, the substrate holding unit is provided with a purging gas blowing means for blowing a purging gas against the surface of the inspection substrate.

When the substrate holding unit is provided with the purging gas blowing means, the purging gas can be sprayed on the surface of the inspection substrate and dust and such adhering to the measuring means can be removed while the inspection substrate is held in the substrate holding unit.

Desirably, the control means controls a carrying operation for carrying the inspection substrate to subject the inspection substrate to predetermined processes in the plurality of modules after a predetermined time has elapsed or after the completion of processing a predetermined number of substrates.

When the control means thus operates, the modules can be inspected every passage of the predetermined time or every completion of processing a predetermined number of substrates, such as substrates in a lot. The tendency of variation of measured data can be accurately determined on the basis of data obtained by thus periodically inspecting the modules.

Desirably, the plurality of measuring means for carrying out the plurality of different kinds of measurement are some of those for measuring the levelness of the inspection substrate, measuring the temperature of the surface of the inspection substrate, measuring air velocity relative to the surface of the inspection substrate, measuring the atmospheric pressure on the surface of the inspection substrate, and measuring humidity in the vicinity of the surface of the inspection substrate.

It is possible not only to verify measured data by the plurality of measuring means for carrying out the plurality of different kinds of measurement, but also to estimate matters that cannot be estimated from individual measured data on the basis of combinations of the measured data, e.g. to estimate the correlation of the change of film thickness after drying by the heat-processing device on the basis of the combination of temperature and air velocity, to estimate surface temperature gradient caused by dust adhering to the heating plate, namely, the condition of the surface of the heating plate, on the basis of the combination of temperature and levelness, and to estimate the correlation of the change of the thickness of a resist film in the coating device on the basis of temperature, and atmospheric pressure or humidity.

A system inspecting method according to the present invention for carrying out predetermined measurement and inspection of a substrate processing system provided with a plurality of modules for processing a substrate includes the steps of: subjecting an inspection substrate provided with a plurality of measuring means for carrying out a plurality of kinds of measurement and a recording means for recording measured data provided by the plurality of measuring means to predetermined processes in the plurality of modules; carrying out measurement by the measuring means of the inspection substrate in each of the modules and recording measured data in the recording means; and obtaining a plurality of different kinds of measured data recorded in the recording means from the inspection substrates processed by the predetermined processes in the plurality of modules.

Desirably, the step of obtaining the plurality of different kinds of measured data recorded in the recording means obtains the measured data by a wire or a wireless data communication system.

The system inspecting method including those steps can achieve the plurality of kinds of measurement simultaneously in each module by the plurality of different kinds of measuring means. Since the measured data of all the modules is stored by the recording means, the plurality of kinds of measurement can be continuously carried out for all the modules, and the measured data on all the inspected modules can be obtained at a time by data communication after the measurement of all the modules has been completed.

Thus, all the modules can be inspected efficiently and information about the results of inspection can be easily managed.

It is desirable to execute the step of carrying out the series of steps every passage of a predetermined time or every completion of processing a predetermined number of substrates, and the step of estimating the number of substrates that can be processed before the values of matters for inspection estimated from the values of matters for measurement and the plurality of kinds of measurement become different from proper values. Desirably, the step of sending out a warning is executed and the step of adjusting the estimated values of the matters for measurement to proper values are executed when the estimated number of substrates that can be processed estimated in the step of estimating the number of substrates that can be processed is smaller than a predetermined number.

Maintenance can be efficiently managed and yield can be improved by estimating the number of substrates that can be processed before the values of matters for inspection estimated from the values of matters for measurement and the plurality of kinds of measurement become different from proper values.

Desirably, the plurality of measuring means for carrying out the plurality of different kinds of measurement include some of a measuring means for measuring the levelness of the inspection substrate, a measuring means for measuring the temperature of the surface of the inspection substrate, a measuring means for measuring velocity of air relative to the surface of the inspection substrate, a measuring means for measuring the atmospheric pressure on the surface of the inspection substrate, and a measuring means for measuring humidity in the vicinity of the surface of the inspection substrate.

It is possible not only to verify measured data by the plurality of different kinds of measuring means, but also to estimate matters that cannot be estimated from individual measured data on the basis of combinations of the measured data, e.g. to estimate the correlation of the change of film thickness after drying by the heat-processing device on the basis of the combination of temperature and air velocity, to estimate surface temperature gradient caused by dust adhering to the heating plate, namely, the condition of the surface of the heating plate, on the basis of the combination of temperature and levelness, and the correlation of the change of the thickness of a resist film in the coating device on the basis of temperature, and atmospheric pressure or humidity.

Thus the present invention can efficiently inspect all the modules for processing a substrate of the substrate processing system and provides the substrate processing system, the system inspecting method, the system inspecting program and the recording medium storing the system inspecting program.

BEST MODE FOR CARRYING OUT THE INVENTION

Figure 1:
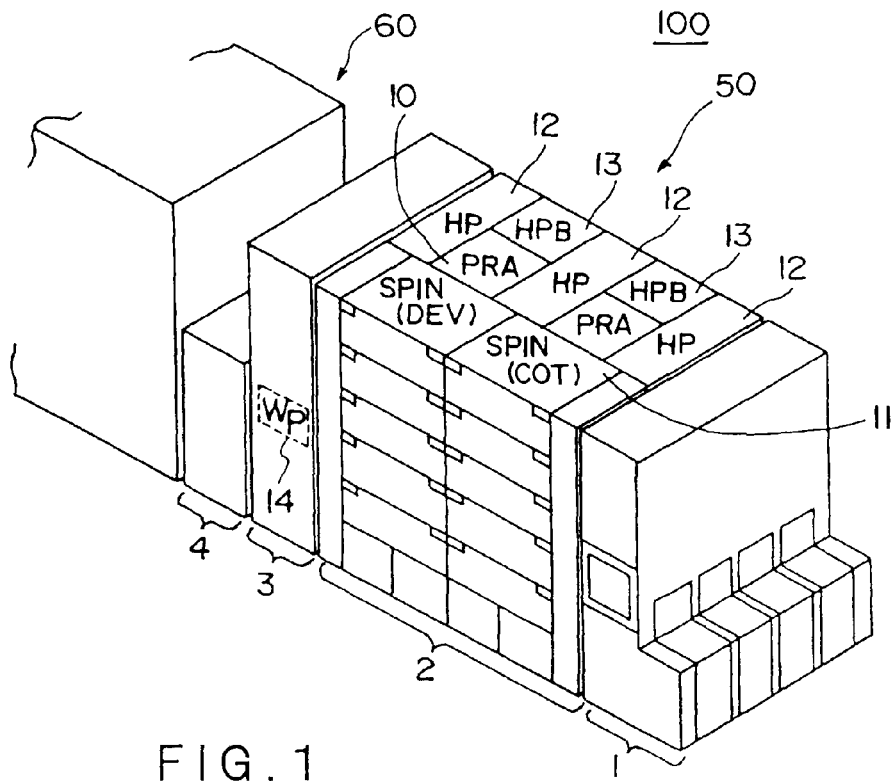
FIG. 1 is a perspective view of a pattern forming system including a coating and developing system to which a substrate processing system of the present invention is applied.

Preferred embodiments of a substrate processing system, a system inspecting method and a system inspecting program according to the present invention will be described with reference to the accompanying drawings. FIG. 1 is a perspective view of a pattern forming system for carrying out a photolithographic process for fabricating electronic devices, such as semiconductor devices and liquid crystal displays, and FIG. 2 is a block diagram typically showing the flow of processes to be carried out by the pattern forming system shown in FIG. 1.

A pattern forming system 100 shown in FIG. 1 includes a coating and developing system 50 to which the substrate processing system of the present invention is applied, and an exposure system 60 that operates in cooperation with the coating and developing system 50 in an in-line processing mode. The coating and developing system 50 has four blocks, namely, a carrier station block (CBS) 1, a processing block (PRB) 2, a main interface block (IFBM) 3 and a secondary interface block (IFBS) 4.

Figure 2:
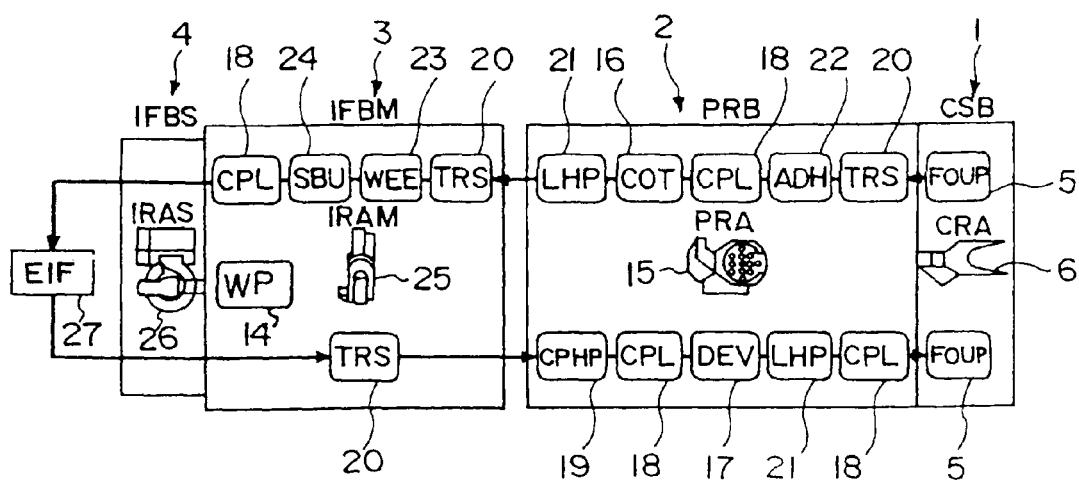
FIG. 2 is a block diagram typically showing the flow of processes to be carried out by the pattern forming system shown in FIG. 1.

Referring to FIG. 2, the carrier station block (CSB) 1 receives and sends out a plurality of carrier cassettes (FOUP) each containing a plurality of wafers, namely, substrates, in an airtight fashion. The carrier station block 1 is provided with a carrier station carrying arm (CRA) 6 for handling the carrier cassettes 5. The processing block (PRB) 2 has four kinds of towers respectively for different processes, namely, PRA towers 10, SPIN towers 11, connecting oven (HP) towers 12, and back oven (HPB) towers 13. Devices called modules for processing a wafer are stacked in layers in each of those towers.

As shown in FIG. 2, the PRA tower 10 is provided with a processing block carrying arm (PRA) 15 capable of vertically moving and of turning about a vertical axis. A carrying arm 15 of the processing bock 2 carries a wafer to and receives a wafer from the modules of the adjacent towers.

The SPIN towers 11 are built by stacking up in layers, for example, five coating stations (COT) 6 for processing a wafer by a coating process for coating a wafer with a resist and five developing stations (DEV) 17 for processing a wafer by a developing process, respectively.

The connecting oven (HP) tower 12 is built by stacking up in layers, for example, chilling plate stations (CPL) 18 each provided with a chilling plate, chilling precision hot plate stations (CPHP) 19, and transition stages (TRS) 20 for transferring a wafer. The back oven tower (HPB) 13 is built by staking up in layers low-temperature hot plate stations (LHP) 21 for carrying out a heat-processing at a low temperature, and adhesion promoting stations (ADH) 22 for processing a wafer by an adhesion promoting process.

The main interface block (IFBM) 3 includes an interface block main carrying arm (IRAM) 25 and is built by stacking up in layers edge exposure stations (WEE) 23 for processing a wafer by an edge exposure process, stationary buffering stage stations (SBU) 24, and an interface block main carrying arm (IRAM) 25 as shown in FIG. 2.

In this embodiment, a wafer holding unit (WP) 14 for holding an inspection wafer WS provided with sensors is formed in a space for one module in the main interface block (IFBM) 3.

The main carrying arm (IRAM) 25 capable of vertically moving and turning about a vertical axis can carry a wafer from one to another of the modules around the main carrying arm (IRAM) 25.

The secondary interface block (IFBS) 4 is provided with a secondary interface block carrying arm (IRAS) 26 as shown in FIG. 2. The secondary interface block carrying arm (IRAS) 26 transfers a wafer between the coating and developing system 50 and an exposure system interface (EIF) 27, which will be described later, of the exposure system 60.

The exposure system 60 exposes a wafer coated with a resist to light through a reticle provided with a circuit pattern. The exposure system 60 receives a wafer from and transfers a wafer to the coating and developing system 50 through the exposure system interface (EIF) 27, namely, a wafer transfer means.

When the pattern forming system 100 executes a normal wafer processing operation, the carrier station carrying arm (CRA) 6 carries a carrier cassette (FOUP) 5 containing wafers not yet processed to the carrier station block (CSB) 1. A carrying mechanism, not shown, carries a wafer from the carrier cassette (FOUP) 5 to the transition station (TRS) 20, namely, a transfer stage. After alignment has been completed, the carrying arm (PRA) 15 carries the wafer to the adhesion promoting station (ADH) 22. The wafer processed by an adhesion promoting process at the adhesion promoting station (ADH) 22 is subjected to a predetermined chilling process at the chilling plate station (CPL), and then the wafer is subjected to a coating process for coating the wafer with a resist at the coating station (COT) 16.

Then, the wafer is subjected to a predetermined heating process, namely, a prebaking process, at the hot plate station (LHP) 21. Then, the wafer is carried to the transition stage (TRS) of the main interface block (IFBM) 3. The main carrying arm (IRAM) 25 of the interface block carries the wafer to the edge exposure station (WEE) 23, and then the wafer is subject to an edge exposure process. Then, the wafer is held temporarily at the stationary buffering stage (BU) 24.

Subsequently, the wafer is subjected to a chilling process at the chilling plate station (CPL). Then, the secondary interface block carrying arm (IFBS) 26 carries the wafer through the secondary interface block (IFBS) 4 to the exposure system 60. The exposure system 60 processes the wafer by an exposure process.

The wafer processed by the exposure process is carried through the secondary interface block (IFBS) 4 to the transition stage (TRS) 20 of the main interface block (IFBM) 3. The wafer is subjected to a predetermined heating process at the chilling precision hot plate station (CPHP) 19 and is subjected to a chilling process at the chilling plate station (CPL) 18.

Subsequently, the wafer is delivered to the developing station (DEV) 17 and is subjected to a developing process. The resist is dried at the low-temperature hot plate station (LHP) 21. The wafer is subjected to a heating process, namely, a postexposure baking (PEB) process, to enhance the adhesion of the resist to the wafer. The wafer is subjected to a chilling process at the chilling plate station (CPL) 18, and then the wafer is returned to the carrier cassette (FOUP) 5.

An inspection method of inspecting the modules of the coating and developing system 50, and a mechanism for carrying out the inspection method will be described. This embodiment measures the levelness of a wafer, the temperature and velocity of air acting on the wafer, atmospheric pressure on the surface of the wafer and humidity in the vicinity of the surface of a wafer.

As mentioned above, the wafer holding unit (WP) 14 for holding the inspection wafer WS provided with sensors is formed in one of the modules of the main interface block (IFBM) 3 to hold the inspection wafer WS therein. The wafer holding unit (WP) 14 may be formed in one of the modules of the processing block (PRB) 2.

Figure 3:
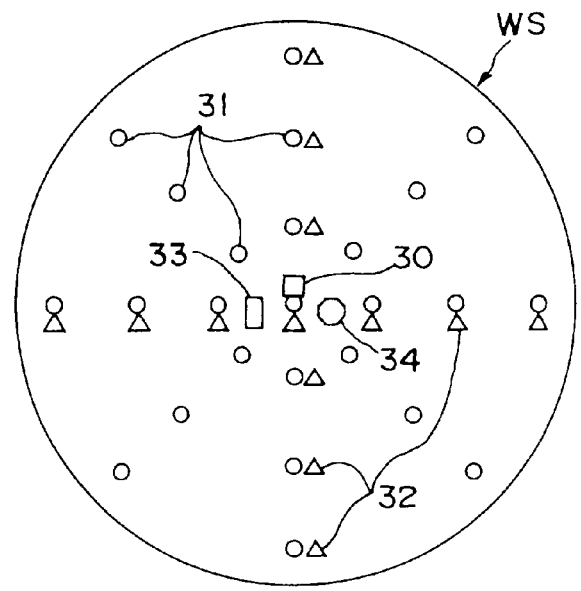
FIG. 3 is a plan view of a sensing wafer provided with sensors employed in the coating and developing system shown in FIG. 1.

As shown in FIG. 3 in a plan view, the inspection wafer WS is provided with a level sensor 30 (measuring means) for measuring the levelness (inclination) of the inspection wafer WS at a substantially central part of the upper surface thereof. An atmospheric pressure sensor 33 (measuring means) for measuring the atmospheric pressure on the surface of the inspection wafer WS and a humidity sensor 34 (measuring means) for measuring humidity in the vicinity of the surface of the inspection wafer WS are disposed on the right and the left side, respectively, of the levelness sensor 30. A plurality of temperature sensors 31 (measuring means) for measuring the respective temperatures of different parts of the upper surface of the inspection wafer WS, and a plurality of breeze sensors 32 (measuring means) for measuring air velocities at different positions on the upper surface of the inspection wafer WS are distributed on the upper surface of the inspection wafer WS. Thus, the inspection wafer WS is provided with the levelness sensor 30, the temperature sensors 31, the breeze sensors 32, the atmospheric pressure sensor 33 and the humidity sensor 34 to achieve the measurement of different matters for measurement by a single wafer.

Figure 4:
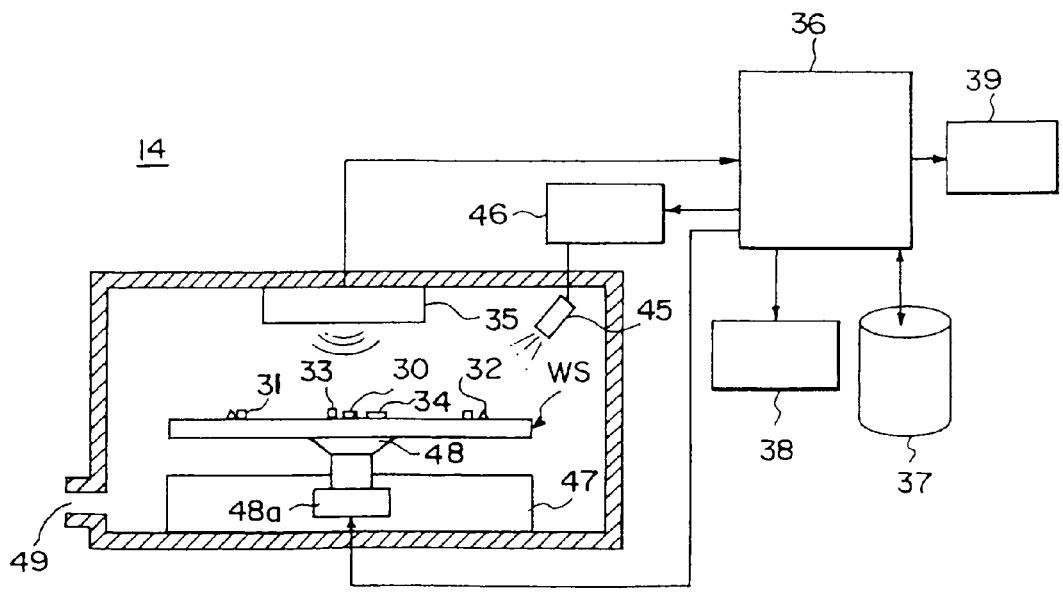
FIG. 4 is a sectional view of a wafer holding unit (WP) included in the coating and developing system shown in FIG. 1.

The main carrying arm (IRAM) 25 carries the inspection wafer WS through an opening, not shown, into the wafer holding unit (WP) 14. As shown in FIG. 4 a sectional view, a base unit 47 is installed in the wafer holding unit WP) 14. A spin chuck 48 is placed on the base unit 47. The spin chuck 48 holds the inspection wafer WS thereon by suction and is rotated about a vertical axis by a motor 48 placed in the base unit 47.

A communication unit 35 (first communication means) is attached to the top wall of the wafer holding unit (WP) 14. The communication unit 35 obtains measured values measured by the plurality of sensors (measured data) by, for example, infrared communication.

The communication unit 35 is connected to a controller 36 (control means), such as a computer, included in the coating and developing system 50 to send the measured data provided by the plurality of sensors to the controller 36. The controller 36 can record the received measured data on a storage device 37, such as a hard disk, can display the measured data on a monitor 38 and can print out the measured data by a printer 39.

Operations for writing data to and reading data from the storage device 37 is controlled by the controller 36. A predetermined inspection program, namely, a piece of software, specifying inspection procedures using the inspection wafer WS for inspecting the modules is stored in the storage device 37. The controller 36 reads the inspection program from the storage device 37 and controls inspection operations according to the inspection program. Although the storage device 37 for storing the inspection program may be a hard disk as mentioned above, the storage device 37 is not limited to a hard disk and may be any suitable storage medium, such as a compact disk, a magnetooptical disk or a memory card.

A purging gas nozzle 45 (purging gas blowing means) for blowing a purging gas against the surface of the inspection wafer WS is disposed above the inspection wafer WS held on the spin chuck 48 in the wafer holding unit (WP) 14. The controller 36 controls a purging gas supply unit 46 (purging gas supplying means) so as to supply the purging gas to the purging gas blowing nozzle 45 at a predetermined flow rate.

The purging gas is blown through the purging gas blowing nozzle 45 against the surface of the inspection wafer WS to removed dust and such adhering to the inspection wafer WS from the inspection wafer WS so that dust and such may not exert a bad influence on the sensing operations of the sensors in the inspection of the next module.

The purging gas blown against the inspection wafer WS is discharged through a discharge port 49. The inspection wafer WS held on the spin chuck 48 is rotated at a predetermined rotating speed while the purging gas is blown against the inspection wafer WS to facilitate removing dust and such from the inspection wafer WS.

Desirably, the purging gas blowing operation is executed periodically for a predetermined time while the inspection wafer WS is held in the wafer holding unit (WP) 14. Preferably, the blowing operation is controlled such that the purging gas is blown against the inspection wafer WS for a predetermined time immediately before the inspection wafer WS is carried out for the wafer holding unit (WP) 14 in response to an inspection start command provided by the controller 36.

Figure 5:
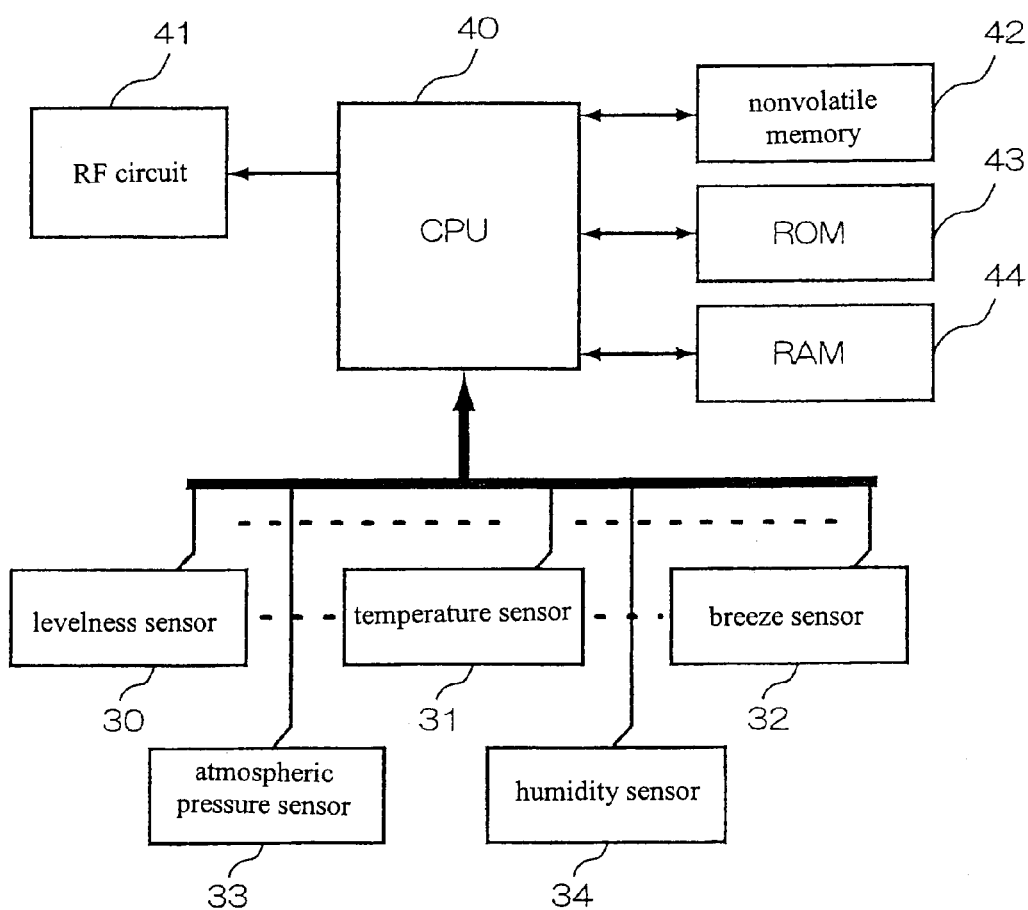
FIG. 5 is a block diagram of a circuit formed on the sensing wafer.

As shown in FIG. 5 in a block diagram, the levelness sensor 30, the temperature sensors 31, the atmospheric pressure sensor 33 and the humidity sensor 34 are connected to a CPU (central processing unit) 40 of a computer embedded in the inspection wafer WS.

The CPU 40 is connected to a RF (radio frequency) circuit 41 (second communication means) for communicating with the communication unit 35 by an infrared communication system. The CPU 40 is connected to a nonvolatile memory 42, namely, a storage means, a ROM 43 storing a control program for controlling operations in the inspection wafer WS, and a RAM 44 for temporarily storing data. Those memory devices are embedded in the inspection wafer WS.

A rechargeable battery is used as a power supply for supplying power to the electric circuit formed in the inspection wafer WS. The battery is charged by, for example, electrically connecting the battery to the base unit 47 when the inspection wafer WS is placed on the spin chuck 48 and operating the base unit 47 as a power supply. The battery may be charged by wireless charging using an electromagnetic induction coil (primary coil) embedded in the spin chuck 48 and a receiving coil (secondary coil) embedded in the inspection wafer WS. The battery may be charged by wireless power transmission technique using microwaves.

A module inspecting procedure controlled by the controller 36 of the coating and developing system 50 will be described with reference to a flow chart shown in FIG. 6. When the module is to be inspected at the installation or at the periodic inspection of the coating and developing system 50, the main carrying arm (IRAM) of the interface block takes out the inspection wafer WS from the wafer holding unit (WP) 14, the carrying arm (PRA) 15 of the processing block delivers the inspection wafer WS to the desired module in the PRA tower 10.

The module received the inspection wafer WS subjects the inspection wafer WS to, for example, a heating process for heating the inspection wafer WS and an air supply process for supplying air into the chamber in step S1.

In step S2, the levelness sensor 30 of the inspection wafer WS sends a signal conveying data on the levelness (inclination) of the inspection wafer W in a state where the inspection wafer W is held by suction on a chuck, not shown, placed on a heating plate or placed on a cooling plate to the CPU 40, and the CPU 40 writes the received data to a predetermine address in the nonvolatile memory 42.

In step S2, the temperature sensors 31 measures the respective temperatures of parts of the surface of the inspection wafer WS and sends measured temperatures to the CPU 40, and the CPU 40 writes the measured data to predetermined addresses of the nonvolatile memory 42.

In step S2, the breeze sensors 32 measure the velocities of air blown against parts of the surface of the inspection wafer WS and send measured temperatures to the CPU 40, and the CPU 40 writes the received velocities to predetermined addresses in the nonvolatile memory 42.

The atmospheric pressure sensor 33 measures atmospheric pressure on the surface of the inspection wafer WS and sends a measure atmospheric pressure to the CPU 40. The CPU 40 stores the received atmospheric pressure to a predetermined address in the nonvolatile memory 42 in step S2.

In step S2, the humidity sensor 34 measures humidity in the vicinity of the surface of the inspection wafer WS and sends a measured humidity to the CPU 40, and the CPU 40 stores the received humidity to a predetermined address in the nonvolatile memory 42.

After inspection and measurement of those parameters of all the modules have been completed in step S3, the inspection wafer WS is returned to the wafer holding unit (WP) 14 in step S4.

In step S5, the controller 35 sends a data transmission command through the communication unit 35 to the inspection wafer WS held in the wafer holding unit (WP) 14 by infrared communication, and the inspection wafer WS sends out the measured data stored in the nonvolatile memory 42 through the RF circuit 41. The controller 36 thus obtains the measured data on all the modules to be inspected and stores the measured data in a predetermined area in the storage device 37.

In step S6, the measured data stored in the nonvolatile memory 42 is deleted after sending out the measured data to prepare for the next inspection cycle. Operations for deleting the measured data may be executed according to a program stored in the ROM 43 or according to commands received from the controller 36.

A charging operation for charging the battery included in the electric circuit formed in the inspection wafer WS is accomplished while the inspection wafer WS is held in the wafer holding unit 14.

Since the controller 36 can simultaneously obtain a plurality of kinds of measured data, the measured data provided by the sensors can be verified, and matters that cannot be estimated from the individual measured data can be estimated on the basis of combinations of the measured data for example, the correlation of the change of film thickness after drying by the heat processing device can be estimated on the basis of the combination of temperature and air velocity, surface temperature gradient caused by dust adhering to the heating plate, namely, the condition of the surface of the heating plate, can be estimated on the basis of the combination of temperature and levelness, and the correlation of the change of the thickness of a resist film in the coating device can be estimated on the basis of temperature, and atmospheric pressure or humidity.

Desirably, the loop of steps S1 to S6 for measurement and inspection is executed every completion of processing a predetermined number of wafers, namely, wafers in a lot, or every passage of a predetermined time.

Figure 6:
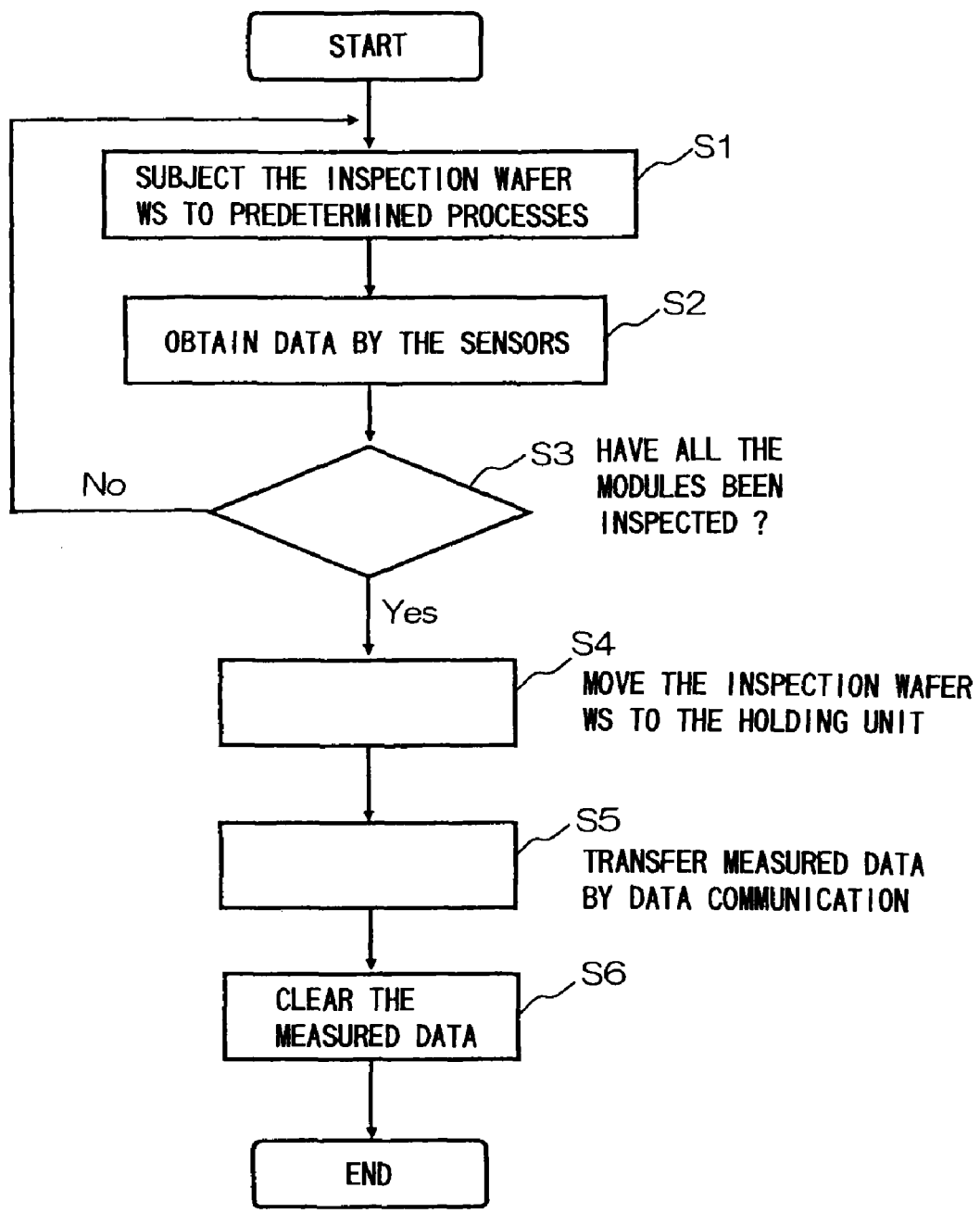
FIG. 6 is a flow chart of an inspection procedure to be controlled by a controller included in the coating and developing system.
Figure 7:
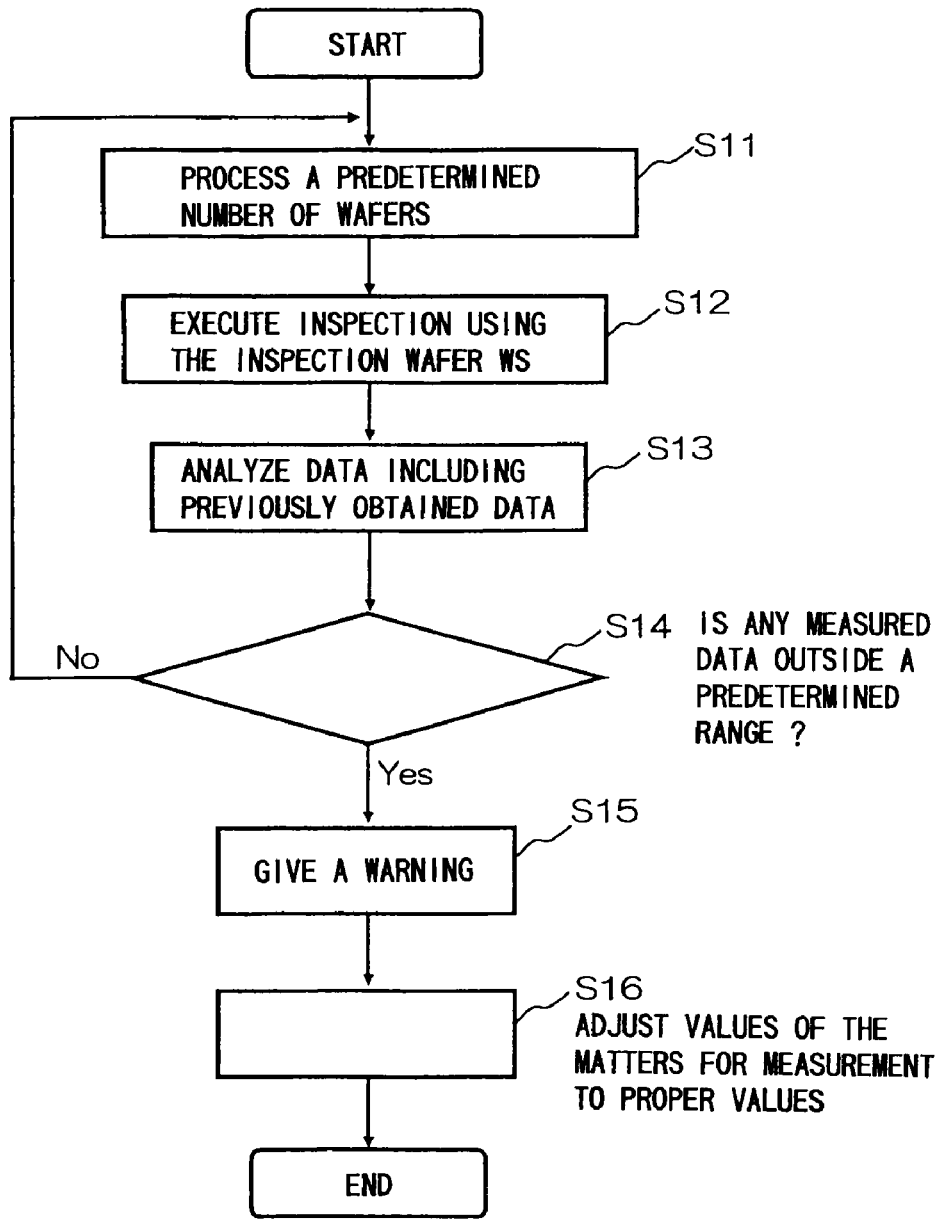
FIG. 7 is a flow chart of procedure for executing the inspection procedure shown in FIG. 6 after the completion of processing a predetermined number of wafers.

As illustrated by a flow chart shown in FIG. 7, the inspection procedure using the inspection wafer WS, namely, the inspection procedure shown in FIG. 6, is executed in step S12 after a wafer processing operation has processed a predetermined number of wafers or has been continued for a predetermined time in step S11.

In step S13, the controller 36 analyses measured data obtained by this inspection cycle and the past measured data adjusted after the preceding inspection cycle (temperature, atmospheric pressure, humidity, air velocity and levelness which were adjusted properly) and estimates values of the matters for measurement (temperature, atmospheric pressure, humidity, air velocity and levelness) and the number of wafers that can be processed before the values of the matters for inspection estimated from a plurality of kinds of measurement deviate from proper ranges on the basis of changes (change ratios) of the measured values measured by the sensors.

Desirably, graphs and tables of the results of the analysis made in step S13 are displayed on the monitor 38.

When there is no possibility that the values of the matters for inspection estimated from all the matters for measurement of all the modules and through the plurality of kinds of measurement deviate from the proper ranges, respectively, step S11 is executed to process new wafers. When it is decided in step S14 that there is the possibility that any one of the values of the matters for inspection estimated from all the matters for measurement of all the modules and through the plurality of kinds of measurement deviate from the proper ranges, i.e., when the number of wafers estimated in step S13 is smaller than the predetermined number of wafers that can be processed, a sound or visual warning is given in step S15 and the matters for measurement are adjusted to proper values automatically in step S16.

According to the present invention, values of the plurality of matters for inspection can be simultaneously measured by the plurality of different kinds of sensors incorporated into the single inspection wafer WS. Since the measured data is stored in the nonvolatile memory 42, the plurality of kinds of measurement of all the modules to be inspected can be continuously carried out and, eventually, the measured data on all the inspected modules can be simultaneously obtained through data communication. Thus, all the modules can be efficiently inspected and information about the results of inspection can be easily managed.

Since the inspection using the inspection wafer WS is executed after a predetermined number of wafers have been processed, the time when the values of the matters for measurement and those of the matters for inspection will deviate from the proper ranges, respectively, can be estimated from the change ratios of measured data measured by the same sensors. Maintenance work can be easily and efficiently carried out and the yield can be improved by generating a warning alarm and automatically carrying out adjustment.

The controller 36 of the foregoing embodiment obtains the measured data from the inspection wafer WS by wireless communication of an infrared communication system. For example, the communication unit 35 may be brought into contact with the inspection wafer WS for wire communication. Communication system for wireless communication is not limited to the infrared communication system and may be some other communication system, such as the Bluetooth system.

The measuring means of the foregoing embodiment measures the levelness of the wafer, the velocity of air acting on the wafer, the temperature of the wafer, the atmospheric pressure on the surface of the wafer, and the humidity in the vicinity of the surface of the wafer. However, there are not restrictions on the types of the matters for measurement and values for measurement, and two to four or six or more kinds of matters for measurement may be measured.

In the foregoing embodiment, the holding unit (WP) 14 for holding the inspection wafer WS is formed in a space for one module in the main interface block (IFBM) 3. The holding unit (WP) 14 may be formed in an empty space for one module in some other block.

The holding unit 14 is not limited to that capable of holding the single inspection wafer WS and may be a holding unit capable of holding a plurality of inspection wafers WS respectively for the inspection of different modules.

Although the foregoing embodiment has been described as applied to a system for processing semiconductor wafers by way of example, the present invention is applicable to systems for processing substrates for LCDs, substrates for CDs, glass substrates, photomasks and printed wiring boards.

INDUSTRIAL APPLICABILITY

The present invention is applicable to resist pattern forming systems for processing substrates, such as semiconductor wafers and is suitable for use in the semiconductor device manufacturing industry and the electronic device manufacturing industry.

The invention claimed is:

1. A substrate processing system, comprising
a plurality of modules for substrate processing including,
at least a coating module which applies a resist solution to a surface of a substrate to be processed,
a heating module which heats a substrate to be processed coated with the resist solution, and
a developing module which develops a substrate with an exposed pattern circuit;
said substrate processing system further comprising:
an inspection substrate, which is transferred to the plurality of modules for inspection therein, provided with a plurality of measuring devices which carry out a plurality of different kinds of measurements and a recorder which records measured data provided by the measuring devices; and
a controller that executes control operations to subject the inspection substrate to predetermined processes in the plurality of modules;
wherein
the plurality of measuring devices comprise at least two of a first measurement device which measures the levelness of the inspection substrate, a second measurement device which measures the temperature of the surface of the inspection substrate, a third measurement device which measures air velocity relative to the surface of the inspection substrate, a fourth measurement device which measures the atmospheric pressure on the surface of the inspection substrate, and a fifth measurement device which measures humidity in the vicinity of the surface of the inspection substrate, and
the controller obtains through data communication a plurality of different kinds of measured data recorded by the recorder of the inspection substrate as the inspection substrate is processed by the predetermined processes by the plurality of modules.

2. The substrate processing system according to claim 1 further comprising a substrate holding unit which holds the inspection substrate in a period in which the inspection substrate is not subjected to the predetermined processes in the plurality of modules.

3. The substrate processing system according to claim 2, wherein the substrate holding unit is provided with a first communication means for data communication with the inspection substrate under the control of the controller, the inspection substrate is provided with a second communication means for communication with the first communication means, and the first and the second communication means communicate with each other for data communication by a wire communication system or a wireless communication system.

4. The substrate processing system according to claim 2, wherein the substrate holding unit is provided with a power supply which supplies power to the inspection substrate, the inspection substrate has a battery as a driving power source for driving an electric circuit including at least the plurality of measuring devices, and the power supply supplies power to the battery by a wire transmission system or a wireless transmission system to charge the battery.

5. The substrate processing system according to claim 2, wherein the substrate holding unit is provided with a purging gas blower which blows a purging gas against the surface of the inspection substrate.

6. The substrate processing system according to claim 1, wherein the controller controls a carrying operation for carrying the inspection substrate to subject the inspection substrate to predetermined processes in the plurality of modules every passage of a predetermined time or every completion of processing a predetermined number of substrates.

7. The substrate processing system according to claim 1, wherein a software program for a predetermined inspecting operation for inspection of each of the plurality of modules is stored in the recorder, and data acquired through the plurality of different kinds of measurements are written to a predetermined address of the recorder.

8. A system inspecting method of carrying out inspection of a substrate processing system provided with a plurality of modules for substrate processing including at least a coating module which applies a resist solution to a surface of a substrate to be processed, a heating module which heats a substrate to be processed coated with the resist solution, and a developing module which develops a substrate with an exposed pattern circuit, said system inspecting method comprising the steps of:
subjecting an inspection substrate, which is transferred to the plurality of modules for inspection therein, provided with a plurality of measuring devices which carry out a plurality of kinds of measurements and a recorder which records measured data provided by the plurality of measuring devices to predetermined processes in the plurality of modules;
carrying out measurements by the measuring devices of the inspection substrate in each of the modules and recording the measured data in the recorder; and
obtaining a plurality of different kinds of measured data recorded in the recorder from the inspection substrate processed by the predetermined processes in the plurality of modules;
wherein
the plurality of measuring devices comprise at least two of a first measurement device which measures the levelness of the inspection substrate, a second measurement device which measures the temperature of the surface of the inspection substrate, a third measurement device which measures air velocity relative to the surface of the inspection substrate, a fourth measurement device which measures the atmospheric pressure on the surface of the inspection substrate, and a fifth measurement device which measures humidity in the vicinity of the surface of the inspection substrate.

9. The system inspecting method according to claim 8 further comprising:
   repeating the subjecting an inspection substrate to predetermined processes in the plurality of modules, the carrying out measurements by the measuring devices, and the obtaining a plurality of different kinds of measured data recorded in the recorder every passage of a predetermined time or every completion of a predetermined number of substrates by the substrate processing system; and
   estimating the number of substrates that can be processed before estimated inspection values estimated from measurement values from the plurality of kinds of measurement become different from acceptable values.

10. The system inspecting method according to claim 9, further comprising giving a warning in the step estimating the number of substrate that can be processed when the number of substrate that can be processed is equal to or below a predetermined number.

11. The system inspecting method according to claim 10, further comprising adjusting operation of the substrate processing system when the estimated number of substrates that can be processed is equal to or below the predetermined number such that estimated inspection values coincide with the acceptable values, respectively.

12. The system inspecting method according to claim 8, wherein the obtaining the plurality of different kinds of measured data recorded in the recorder obtains the measured data by a wire or a wireless data communication system.

13. The system inspecting method according to claim 8, further comprising:
   storing a software program for predetermined inspecting operation for inspecting each of the plurality of modules at the recorder; and
   writing data acquired through the plurality of different kinds of measurement to a predetermined address in the recorder.

14. A non-transitory recording medium storing a program including a set of instructions for a computer to execute the steps set forth in claim 8 so as to be readable by the computer.

* * * * *